(12) United States Patent
Zhe et al.

(10) Patent No.: US 8,628,648 B2
(45) Date of Patent: Jan. 14, 2014

(54) APPARATUS AND METHOD FOR MANIPULATING MICRO COMPONENT

(75) Inventors: Jiang Zhe, Copley, OH (US); Abhay Vasudev, Akron, OH (US)

(73) Assignee: The University of Akron, Akron, OH (US)

( * ) Notice: Subject to any disclaimer, the term of this patent is extended or adjusted under 35 U.S.C. 154(b) by 543 days.

(21) Appl. No.: 12/830,931

(22) Filed: Jul. 6, 2010

(65) Prior Publication Data

US 2011/0005931 A1    Jan. 13, 2011

Related U.S. Application Data

(60) Provisional application No. 61/223,514, filed on Jul. 7, 2009.

(51) Int. Cl.
*G01N 27/447* (2006.01)
*G01N 27/453* (2006.01)
*B25B 11/00* (2006.01)
*B01L 9/00* (2006.01)

(52) U.S. Cl.
USPC ............................ 204/450; 204/600; 422/500

(58) Field of Classification Search
USPC .................. 204/600–621, 641–645, 450–470, 204/546–550; 435/5; 422/500
See application file for complete search history.

(56) References Cited

U.S. PATENT DOCUMENTS

| | | | | |
|---|---|---|---|---|
| 7,147,763 | B2 * | 12/2006 | Elrod et al. | 204/547 |
| 2006/0102477 | A1 * | 5/2006 | Vann et al. | 204/450 |
| 2006/0226013 | A1 * | 10/2006 | Decre et al. | 204/601 |
| 2006/0228566 | A1 * | 10/2006 | Luten et al. | 428/429 |
| 2008/0286751 | A1 * | 11/2008 | Renaud et al. | 435/5 |
| 2010/0112286 | A1 * | 5/2010 | Bahadur et al. | 428/141 |

OTHER PUBLICATIONS

Moon et al. Low voltage electrowetting-on-dielectric, J. Appl. Phys, 2002, 4080.*
Vasudev et al. A low-voltage droplet microgripper for microbject manipulation, 2009, 1-8.*
Bohringer et al., Chapter 55 Microassembly, The Handbook of Industrial Robotics, 2nd ed. (Wiley, New York, Feb. 16, 1999), pp. 1045-1066.
Grier, A Revolution in Optical Manipulation, Nature, vol. 424, No. 6950, Aug. 14, 2003, pp. 810-816.
Chiou et al., Massively Parallel Manipulation of Single Cells and Microparticles Using Optical Images, Nature, vol. 436, No. 7049, Jul. 21, 2005, pp. 370-372.

(Continued)

*Primary Examiner* — Alex Noguerola
(74) *Attorney, Agent, or Firm* — Renner, Kenner, Greive, Bobak, Taylor & Weber (57) ABSTRACT

In one embodiment, a system for manipulation of a micro component includes a gripper subsystem for lifting, holding, and releasing a micro component. The gripper subsystem includes a base substrate having a work side and an opposing side, a positive electrode secured to the work side of the base substrate, a negative electrode suitably spaced from the positive electrode and secured to the work side of the base substrate, a dielectric layer formed over the work side of the base substrate and the positive and negative electrodes, and a hydrophobic layer comprising a hydrophobic material with predictable electrowetting behavior formed over the dielectric layer such that the dielectric layer is between the work side of the base substrate and the hydrophobic layer. A method for manipulation of a micro component is also provided as well as a method of manufacturing the system for manipulation of a micro component.

23 Claims, 10 Drawing Sheets

(56) References Cited

OTHER PUBLICATIONS

Shi et al., Focusing Microparticles in a Microfluidic Channel with Standing Surface Acoustic Waves (SSAW), Lab on a Chip, vol. 8, Issue 2, 2008, pp. 221-223.
Cecil et al., 2007, Assembly and Manipulation of Micro Devices—A State of the Art Survey Source, Robotics and Computer-Integrated Manufacturing, vol. 23, Issue 5, Oct. 2007, pp. 580-588.
Tichem et al., Capturing Micro-assembly Process Windows on Process Data Sheets, The 6th IEEE International Symposium on Assembly and Task Planning: From Nano to Macro Assembly and Manufacturing, Jul. 19-21, 2005, pp. 74-79.
Lambert et al., Design Rules for a Capillary Gripper in Microassembly, The 6th IEEE International Symposium on Assembly and Task Planning: From Nano to Macro Assembly and Manufacturing, Jul. 19-21, 2005, pp. 67-73.
Bark et al., Gripping with Low Viscosity Fluids, The 11th Annual Int. Workshop on MEMS, Heidelberg, Germany, Jan. 25-29, 1998, 301-305.
Chandra, A Numerical Study for Liquid Bridge Based Microgripping and Contact Angle Manipulation by Electrowetting Method, PhD Thesis, The University of Akron, Dec. 2007, 232 pages.
Yi et al., Characterization of Electrowetting Actuation on Addressable Single-Side Coplanar Electrodes, J. Micromech. Microeng, vol. 16, Issue 10, Oct. 2006, pp. 2053-2059.
Herberth, Fluid Manipulation by Means of Electrowetting-On-Dielectrics, PhD Thesis, University of Freiburg, May 2006, 184 pages.
Millefiorini et al., Electrowetting of Ionic Liquids, Journal of American Chemical Society, vol. 128, 2006, pp. 3098-3101.

\* cited by examiner

APPARATUS AND METHOD FOR MANIPULATING MICRO COMPONENT

CROSS REFERENCE TO RELATED PATENTS AND APPLICATIONS

This application claims the right of priority and benefit of the earlier filing date of U.S. Provisional Patent Application Ser. No. 61/223,514, filed Jul. 7, 2009, the contents of which are fully incorporated herein by reference.

BACKGROUND

The present exemplary embodiment relates generally to manipulating a micro component by lifting, holding, and releasing the micro component while it is moved from an initial location to a destination location. It finds particular application in conjunction with fabrication of hybrid and complex microelectromechanical systems (MEMS). However, it is to be appreciated that the present exemplary embodiment is also amenable to manipulation of micro components for various purposes, including for other types of fabrication.

Advancements in MEMS technology have led to the design of MEMS devices with complex structures and geometries. MEMS devices are generally fabricated by well established monolithic micromachining where the micro parts are fabricated in one sequential process. However, more complex hybrid microsystems which have complex 3-D geometries and multiple micro components may use diverse materials and conflicting fabrication processes, and thus cannot be manufactured by monolithic micromachining. For these situations, microassembly is necessary to integrate various components into a complex functional system. Microassembly lies between conventional (macro-scale) assembly (i.e., part dimensions greater than 1 mm) and the emerging field of nanoassembly (i.e., part dimensions in the molecular scale, e.g., less than 1 nm). For additional information on microassembly, see Bohringer et al., Chapter 55 Microassembly, The Handbook of Industrial Robotics, 2nd ed. (Wiley, New York, Feb. 16, 1999), pp. 1045-1066, the contents of which are fully incorporated herein by reference.

One major focus of microassembly is microgripping and micromanipulation tools to accurately deliver and place micro parts or components in desired positions. Conventional microgrippers typically generate forces in the order of several Newton's during contact with the micro objects. This amount of force has a tendency to scratch or indent micro objects, and destroy critical features on the component during assembly. In addition, the assembly of micro parts using conventional mechanical microgrippers can be hindered by undesired surface adhesion between a micro part and the gripper, caused by surface forces such as electrostatic forces, van der Waals forces, and capillary forces.

Non-intrusive micro manipulation methods including optical tweezers, electro kinetic traps, and acoustic traps have been reported. For additional information on optical tweezers, see Grier, A Revolution in Optical Manipulation, Nature, Vol. 424, No. 6950, Aug. 14, 2003, pp. 810-816, the contents of which are fully incorporated herein by reference. For additional information on electro kinetic traps, see Chiou et al., Massively Parallel Manipulation of Single Cells and Microparticles Using Optical Images, Nature, Vol. 436, No. 7049, Jul. 21, 2005, pp. 370-372, the contents of which are fully incorporated herein by reference. For additional information on acoustic traps, see Shi et al., Focusing Microparticles in a Microfluidic Channel with Standing Surface Acoustic Waves (SSAW), Lab on a Chip, Vol. 8, Issue 2, 2008, pp. 221-223, the contents of which are fully incorporated herein by reference. Optical tweezers have been used to trap nanoscale particles, but cannot generate large enough optical forces to trap objects with weights in the pNewton order. Electro kinetic and acoustic traps, on the other hand, are only applicable to micro particles suspended in liquid. A review of the various handling principles used in microassembly is provided in Cecil et al., 2007, Assembly and Manipulation of Micro Devices—A State of the Art Survey Source, Robotics and Computer-Integrated Manufacturing, Vol. 23, Issue 5, October 2007, pp. 580-588, the contents of which are fully incorporated herein by reference.

Capillary and surface forces are insubstantial at the macro scale, but are dominant forces at the micro- and nano-scales and can be utilized as a gripping mechanism. Capillary grippers take advantage of capillary lifting force evolving from a liquid bridge between two surfaces. For additional information on capillary grippers, see Tichem et al., Capturing Microassembly Process Windows on Process Data Sheets, The $6^{th}$ IEEE International Symposium on Assembly and Task Planning From Nano to Macro Assembly and Manufacturing, Jul. 19-21, 2005, pp. 74-79, the contents of which are fully incorporated herein by reference. One challenge for a capillary gripper is that, once an object is picked up, the capillary lifting force remains constant and the object is difficult to release. Many release strategies have been proposed to facilitate object release, including reducing the volume of liquid by evaporation or heating, tilting/sliding the gripper with respect to the object, using a hydrophobic (poly)tetrafluoroethylene (PTFE) auxiliary tool, releasing the object by positive mechanical engagement, injection of gas, and using mechanical needles. All these release techniques require external actuation apparatus and increase the system complexity. For additional information on release strategies, see Lambert et al., Design Rules for a Capillary Gripper in Microassembly, The $6^{th}$ IEEE International Symposium on Assembly and Task Planning From Nano to Macro Assembly and Manufacturing, Jul. 19-21, 2005, pp. 67-73, and Bark et al., Gripping with Low Viscosity Fluids, The 11th Annual Int. Workshop on MEMS, Heidelberg, Germany, Jan. 25-29, 1998, 301-305, the contents of which are fully incorporated herein by reference.

INCORPORATION BY REFERENCE

The following publications, the disclosures of each being totally incorporated herein by reference, are mentioned: i) Bohringer et al., Chapter 55 Microassembly, The Handbook of Industrial Robotics, 2nd ed. (Wiley, New York, Feb. 16, 1999), pp. 1045-1066, ii) Grier, A Revolution in Optical Manipulation, Nature, Vol. 424, No. 6950, Aug. 14, 2003, pp. 810-816, iii) Chiou et al., Massively Parallel Manipulation of Single Cells and Microparticles Using Optical Images, Nature, Vol. 436, No. 7049, Jul. 21, 2005, pp. 370-372, iv) Shi et al., Focusing Microparticles in a Microfluidic Channel with Standing Surface Acoustic Waves (SSAW), Lab on a Chip, Vol. 8, Issue 2, 2008, pp. 221-223, v) Cecil et al., 2007, Assembly and Manipulation of Micro Devices—A State of the Art Survey Source, Robotics and Computer-Integrated Manufacturing, Vol. 23, Issue 5, October 2007, pp. 580-588, vi) Tichem et al., Capturing Micro-assembly Process Windows on Process Data Sheets, The $6^{th}$ IEEE International Symposium on Assembly and Task Planning: From Nano to Macro Assembly and Manufacturing, Jul. 19-21, 2005, pp. 74-79, vii) Lambert et al., Design Rules for a Capillary Gripper in Microassembly, The $6^{th}$ IEEE International Symposium on Assembly and Task Planning From Nano to Macro Assembly and Manufacturing, Jul. 19-21, 2005, pp. 67-73, viii) Bark et al., Gripping with Low Viscosity Fluids, The 11th Annual Int. Workshop on MEMS, Heidelberg, Germany, Jan. 25-29, 1998, 301-305, ix) Chandra, A Numerical Study for Liquid Bridge Based Microgripping and Contact Angle Manipulation by Electrowetting Method, PhD Thesis, The University of Akron, December 2007, 232 pages, x) Yi et al., Characterization of Electrowetting Actuation on Addressable Single-Side Coplanar Electrodes, J. Micromech. Microeng, Vol. 16, Issue 10, October 2006, pp. 2053-2059, xi) Herberth, Fluid Manipulation by Means of Electrowetting-On-Dielectrics, PhD Thesis, University of Freiburg, May 2006, 184 pages, and xii) Millefiorini et al., Electrowetting of Ionic Liquids, Journal of American Chemical Society, Vol. 128, 2006, pp. 3098-3101.

BRIEF DESCRIPTION

In one aspect, an apparatus for manipulation of a micro component is provided. In one embodiment, the apparatus includes: a gripper subsystem for lifting, holding, and releasing a micro component, comprising: a base substrate having a work side and an opposing side; a positive electrode secured to the work side of the base substrate; a negative electrode suitably spaced from the positive electrode and secured to the work side of the base substrate; a dielectric layer formed over the work side of the base substrate and the positive and negative electrodes; and a hydrophobic layer comprising a hydrophobic material with predictable electrowetting behavior formed over the dielectric layer such that the dielectric layer is between the work side of the base substrate and the hydrophobic layer. In this embodiment, the base substrate, positive and negative electrodes, dielectric layer, and hydrophobic layer are constructed and arranged such that a DC voltage applied to the positive and negative electrodes can be adjustably controlled in conjunction with providing a liquid droplet to the hydrophobic layer so as to change a capillary force between the liquid droplet and the micro component in order to i) lift the micro component at a lift voltage after moving the gripper subsystem to an initial position of the micro component, ii) hold the micro component at a voltage level within a hold voltage range while the gripper subsystem is moved from the initial position to a delivery position, and iii) release the micro component at a release voltage while at the delivery position, the release voltage being less than the lift voltage and the hold voltage range being between the lift voltage and the release voltage.

In another aspect, a method for manipulation of a micro component is provided. In one embodiment, the method includes: a) providing a gripper subsystem with a base substrate having a work side and an opposing side, a positive electrode secured to the work side of the base substrate, a negative electrode suitably spaced from the positive electrode and secured to the work side of the base substrate, a dielectric layer formed over the work side of the base substrate and the positive and negative electrodes, and a hydrophobic layer comprising a hydrophobic material with predictable electrowetting behavior formed over the dielectric layer such that the dielectric layer is between the work side of the base substrate and the hydrophobic layer; b) controlling a transport subsystem to which the gripper subsystem is mechanically linked for translational movement of the gripper subsystem to an initial position of the micro component; c) controlling a liquid dispensing subsystem to provide a liquid droplet to the hydrophobic layer such that the liquid droplet forms a liquid bridge between the hydrophobic layer and the micro component when the gripper subsystem is moved to within a suitable distance of the micro component; d) applying a DC voltage to the positive and negative electrodes to produce a capillary force between the liquid droplet and the micro component via the liquid bridge; e) adjusting the DC voltage to at least a lift voltage to change the capillary force so that the gripper subsystem lifts the micro component via the liquid bridge; f) reducing the DC voltage to a hold voltage range to reduce the capillary force so that the gripper subsystem holds the micro component while controlling the transport subsystem to move the gripper subsystem from the initial position to a delivery position; and g) reducing the DC voltage to at least a release voltage to reduce the capillary force so that the gripper subsystem releases the micro component at the delivery position.

In yet another aspect, a method of manufacturing an apparatus for manipulation of a micro component is provided. In one embodiment, the method includes: a) transferring patterns for the positive and negative electrodes to a conductive coating on the work side of the base substrate using photolithography; b) wet etching the conductive coating to form the positive and negative electrodes on the work side of the base substrate; c) spin coating a thin layer of dielectric material over the work side of the base substrate and the positive and negative electrodes; d) leaving the thin layer of dielectric material at ambient temperature for a predetermined time to remove volatile components of the dielectric material; e) annealing the thin layer of dielectric material to a predetermined temperature; f) repeating c) through e) until a thin film stack of dielectric material reaches a desired thickness to form the dielectric layer; g) spin coating a thin layer of hydrophobic material over the dielectric layer; and h) curing the thin layer of hydrophobic material at a predetermined temperature for a predetermined time to form the hydrophobic layer.

DETAILED DESCRIPTION

Figure 16:
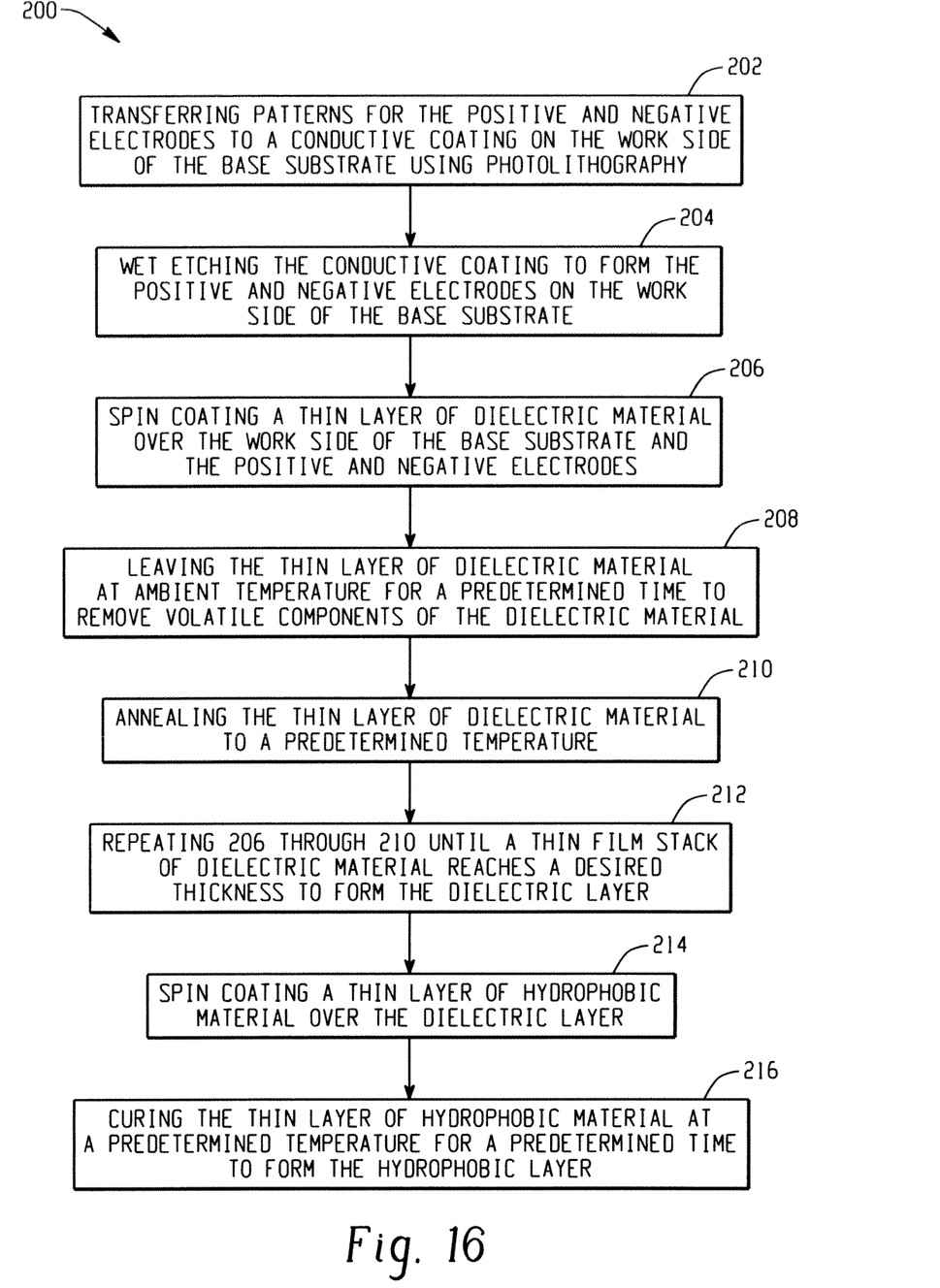
FIG. 16 is a flowchart of an exemplary embodiment of a process for manufacturing an exemplary embodiment of a gripper subsystem.

FIG. 16 is a flowchart of an exemplary embodiment of a process for manufacturing an exemplary embodiment of a gripper subsystem. Electrowetting is a phenomenon which is used to manipulate the contact angles of a liquid by application of an electric potential. Recent simulations have explored theoretical aspects of electrowetting and suggest the feasibility of dynamically adjusting capillary force induced by a liquid bridge. For additional information on the electrowetting simulation, see Chandra, A Numerical Study for Liquid Bridge Based Microgripping and Contact Angle Manipulation by Electrowetting Method, PhD Thesis, The University of Akron, December 2007, 232 pages, the contents of which are fully incorporated herein by reference. The exemplary embodiments described herein provide advancements to the electrowetting experiments modeled by Chandra and implement a capillary microgripper that, for example, can pick up and release micro glass beads by electrowetting. In one exemplary embodiment, a high dielectric constant metal oxide coating layer is used as an insulator to reduce the actuation voltage.

In another exemplary embodiment, a room temperature ionic liquid (RTILs) may be used as the electrowetting liquid for the capillary force microgripper. The non-volatility and thermal stability of ionic liquids make RTILs suitable for droplet-based microgripping, particularly in high temperature and vacuum environments. Moreover, while aqueous electrolyte solutions are popular in electrowetting experiments, water and moisture are detrimental to microelectronic chips. Notably, capillary microgrippers using aqueous droplets may not be suitable for applications in high temperature or vacuum environments because water droplets are volatile. For example, aqueous droplets may not be suitable to manipulate a small sample in a high temperature vacuum chamber of an environmental scanning electron microscope.

RTILs are essentially organic salts that are present in liquid state at room temperature. RTILs have desirable properties, such as high ionic conductivity, negligible vapor pressure, no flammability, thermal stability in a wide temperature range. RTILs have been used for a range of applications, such as organic synthesis, chemical separation, nano material preparation, polymer gel electrolytes, and electrochemical applications. Particular interest has recently arisen in using RTILs as electrowetting liquids as a substitute for volatile aqueous liquids. For additional information on using RTILs as electrowetting liquids, see Millefiorini et al., Electrowetting of Ionic Liquids, Journal of American Chemical Society, Vol. 128, 2006, pp. 3098-3101, the contents of which are fully incorporated herein by reference. Moreover, RTILs are non-aqueous and are not harmful for microelectronics chips their favorable thermal stability and non-volatility makes it particularly suitable for vacuum and high temperature environment applications. Accordingly, several embodiments of a soft capillary microgripper presented herein use RTIL as the electrowetting liquid.

Figure 1:
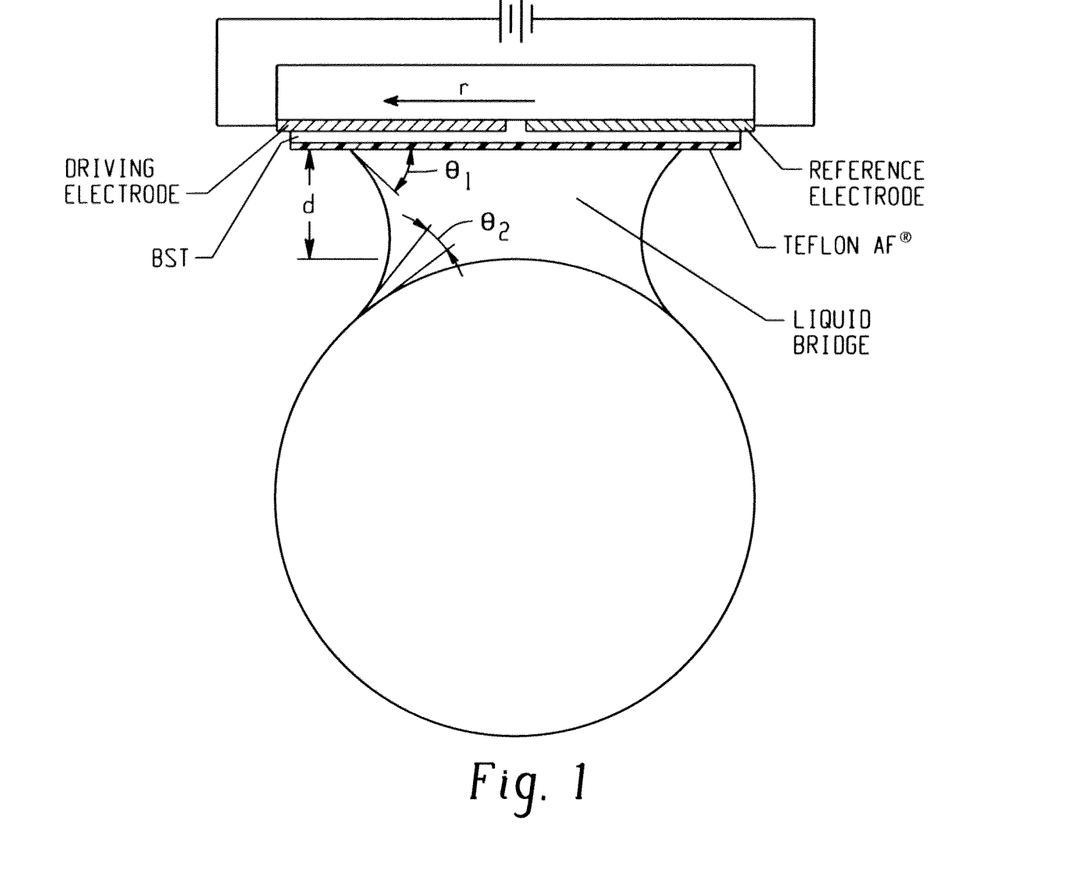
FIG. 1 is block diagram of an exemplary embodiment of a gripper subsystem holding a micro component via a liquid bridge.

With reference to FIG. 1, an exemplary embodiment of a capillary microgripper demonstrates capillary lifting force manipulation. A liquid bridge formed between a gripper surface and an object surface generates the capillary lifting force. The liquid bridge forms contact angles ($\theta_1$) and ($\theta_2$) with the gripper surface and the object surface. The capillary lifting force evolving from the liquid bridge between the two surfaces can be estimated by:

$$F_{capillary} = \frac{\gamma(\cos\theta_1 + \cos\theta_2)A}{d}, \qquad (1)$$

where $\gamma$ is the surface tension of the liquid, d the length of the liquid bridge and A the surface area. For additional information on the capillary lifting force, see Bohringer et al., Chapter 55 Microassembly, The Handbook of Industrial Robotics, 2nd ed. (Wiley, New York, Feb. 16, 1999), pp. 1045-1066, the contents of which are fully incorporated herein by reference.

Figure 2:
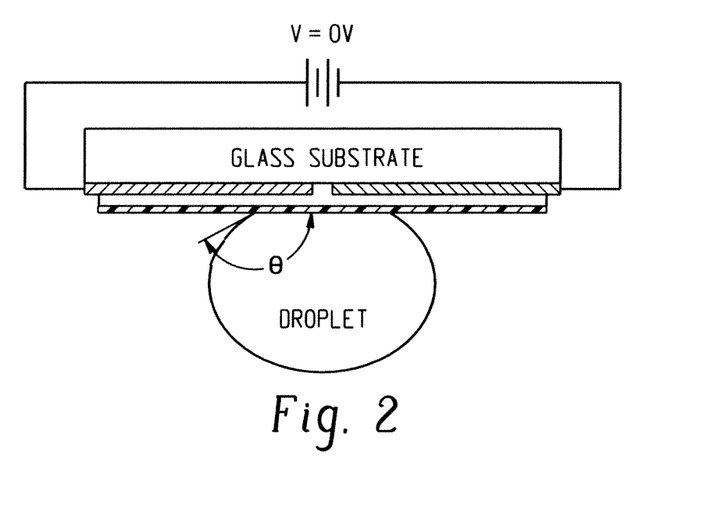
FIG. 2 is a block diagram of another exemplary embodiment of a gripper subsystem with a liquid droplet in place for lifting a micro component and no voltage applied.
Figure 3:
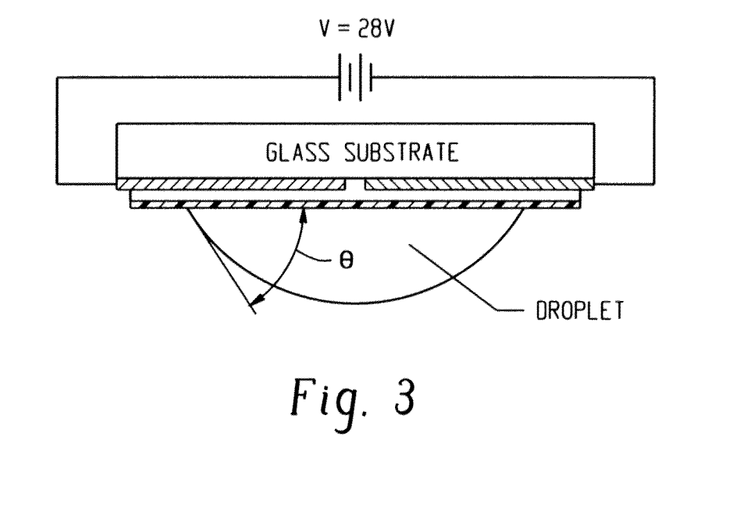
FIG. 3 is a block diagram of the gripper subsystem of FIG. 2 with an exemplary lift voltage applied.

A gripper picks up and holds an object, and releases the object at a desired position. During the pick-up and hold phase, the lifting force is greater than the weight of the micro component; and subsequently to release of the object, the capillary lifting force is reduced to a level at which the weight of the micro component is greater than the lifting force. Electrowetting may be used to manipulate the contact angle ($\theta_1$) between the liquid bridge and the gripper surface to vary the capillary lifting forces (FIGS. 2 and 3). The lifting force is at a minimum ($F_{min}$) at the largest contact angle, increases as $\theta_1$ is reduced, and reaches a maximum ($F_{max}$) at the lowest contact angle. The capillary forces are adjusted between the maximum $F_{max}$ and minimum $F_{min}$ so that an object with mass m between $F_{max}/g$ and $F_{min}/g$ can be picked up and released. Here g is the acceleration due to gravity. The volume of the liquid is assumed to be constant which permits the gravity force of the liquid droplet to be neglected. The electrowetting of a liquid droplet from a hydrophobic state (see FIG. 2) to a hydrophilic state (see FIG. 3) may be accomplished using interdigitated coplanar electrodes.

Figure 4:
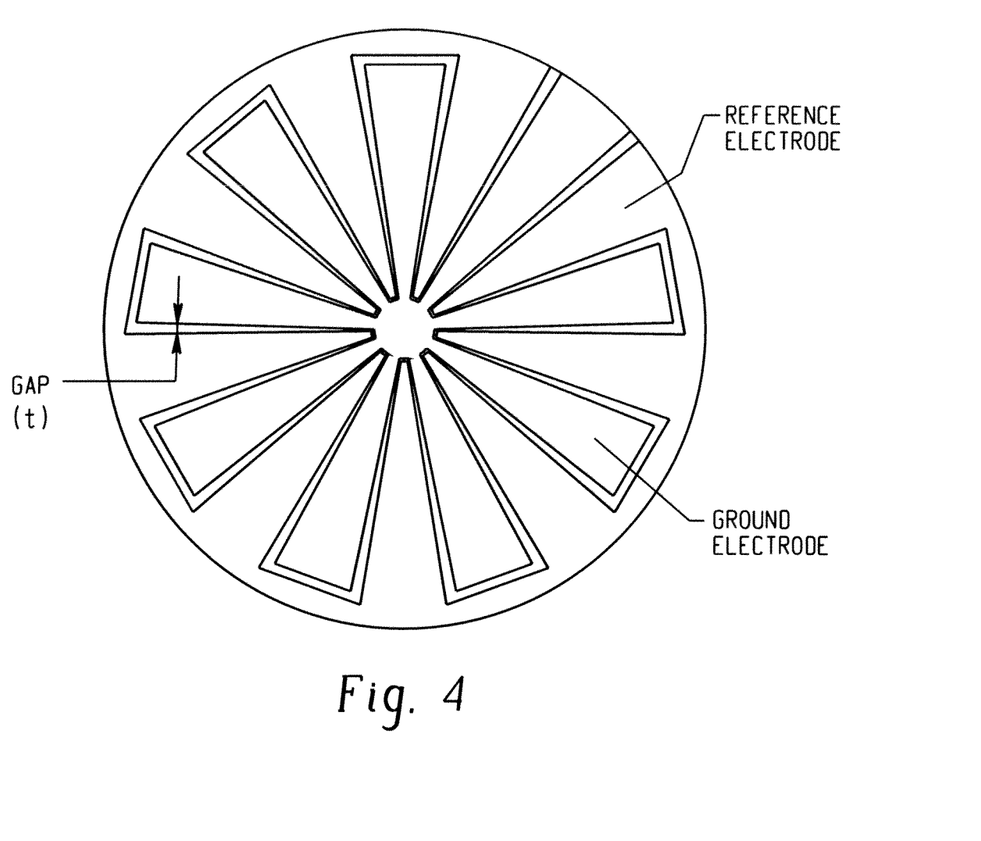
FIG. 4 shows a bottom view of an exemplary arrangement of positive and negative electrodes for an exemplary embodiment of a gripper subsystem.

With reference to FIG. 4, an exemplary embodiment of interdigitated radial coplanar gold electrodes across which a driving voltage is applied are shown. A 0.5 um thin film of Barium Strontium Titanate (BST) is an example of a material that may be used in the microgripper device to form a dielectric layer between the electrodes and the object. BST is a high dielectric constant material having good electrical insulation properties and may be obtained from Gelest, Inc. of Morrisville, Pa. The high dielectric constant of BST is due to the metal alkoxides of barium, strontium and titanium in a solution of higher alcohols. The dielectric constant of BST is found to be ~50. The dielectric insulation layer is topped off with a very thin coating of, for example, Teflon® AF, to provide a hydrophobic surface between the dielectric layer and the object. Teflon® is a registered trademark of E.I. du Pont de Nemours and Company of Wilmington, Del.

The schematic top view of the radial coplanar electrode in FIG. 4 shows a gap (t) between the driving and the reference electrode. An exemplary gap (t) is 20 μm. The coplanar electrode design was previously used to drive droplets in micro channels. However, the coplanar electrode design was not previously used in a microgripper. For additional information on use of the coplanar electrode design to drive droplets in micro channels, see Yi et al., Characterization of Electrowetting Actuation on Addressable Single-Side Coplanar Electrodes, J. Micromech. Microeng, Vol. 16, Issue 10, October 2006, pp. 2053-2059, the contents of which are fully incorporated herein by reference. The electrowetting of a liquid droplet on the gripper surface is illustrated in FIGS. 2 and 3. Electrowetting enables the control of surface wettability by changing the surface tension of the droplet through applied potentials. When a voltage is applied, the contact angle of the liquid is decreased (FIG. 3) from its initial contact angle (FIG. 2). Therefore the lifting forces of the microgripper are manipulated using electrowetting (Equation 1).

The relation between the applied voltage and the contact angle may be expressed by the modified Young-Lippmann equation as:

$$\cos(\theta_V) = \cos(\theta_0) + \frac{\varepsilon_0 \varepsilon_r}{2d\gamma_{LV}} \left[ \frac{A_d}{A_t} \left( \frac{A_d}{A_d + A_r} \right)^2 + \frac{A_r}{A_t} \left( \frac{A_d}{A_d + A_r} \right)^2 \right] V^2, \quad (2)$$

where, $\theta_V$ and $\theta_0$ are the final and initial contact angle, $\varepsilon_0$ is the dielectric constant of air, $\varepsilon_r$ is the dielectric constant of a dielectric layer (e.g., ~50 for BST), d is the thickness of a hydrophobic layer (e.g., Teflon® AF film), $\gamma_{LV}$ is the surface tension of the liquid droplet, and V is the applied voltage. The terms $A_d$, $A_r$, and $A_t$ represent the area of the driving electrode, the reference electrode, and the total area respectively. For additional information on the modified Young-Lippmann equation, see Yi et al., Characterization of Electrowetting Actuation on Addressable Single-Side Coplanar Electrodes, J. Micromech. Microeng, Vol. 16, Issue 10, October 2006, pp. 2053-2059, the contents of which are fully incorporated herein by reference.

Figure 5:
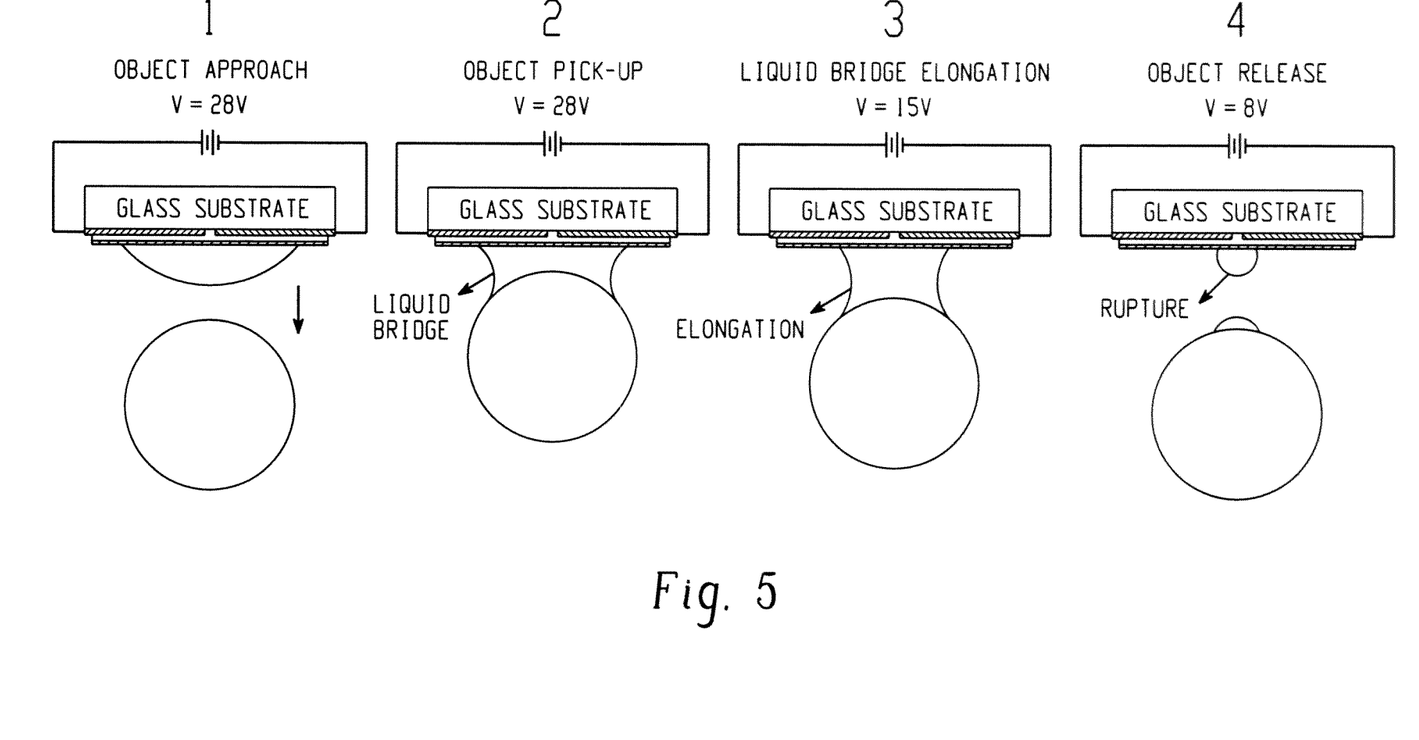
FIG. 5 shows a set of frames of an exemplary sequence in which an exemplary embodiment of a gripper subsystem approaches, lifts, holds, and releases a micro component.

With reference to FIG. 5, micromanipulation using the microgripper may include: 1) approaching an object with a gripper; 2) picking up the object at a high voltage; 3) reducing the applied voltage to elongate the liquid bridge; and 4) releasing the object at a low voltage (i.e., release voltage). The 4-frame sequence of FIG. 5 is described in more detail below.

In the first frame, the Teflon® gripper surface is initially hydrophobic. A liquid droplet may be placed on the center of the gripper. With an applied voltage across the electrodes, the surface becomes hydrophilic and the contact angle is decreased due to an electrowetting on dielectric (EWOD) effect. For example, the gripper may approach the object vertically from the top.

In the second frame, as the gripper moves down, the droplet contacts the object and forms a liquid bridge between the object and the gripper surface. The capillary lifting force evolving from the liquid bridge acts as a lifting force to pick up the object.

In the third frame, once the object is picked up and placed in a desired position, the voltage may be reduced. Due to the EWOD effect, the contact angle ($\theta_1$) increases when the voltage is reduced which leads to a decrease in the lifting force. The decrease in the lifting force results in the liquid bridge being elongated.

In the fourth frame, if the voltage is further decreased, the capillary lifting force will eventually decrease with the decreasing voltage to a point where the weight of the object overcomes the lifting force. At a the release voltage, the liquid bridge ruptures and the object is released.

Figure 6:
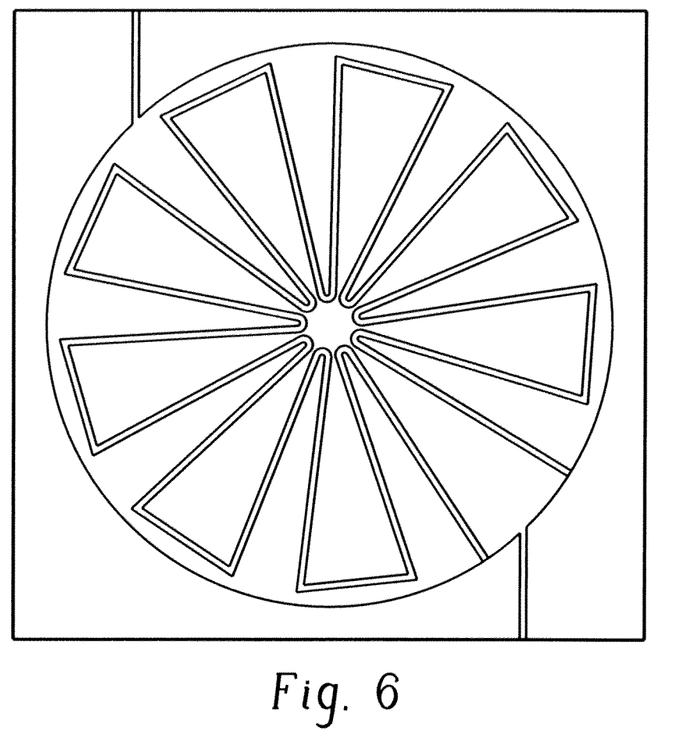
FIG. 6 shows a perspective view of the positive and negative electrodes of FIG. 4.
Figure 7:
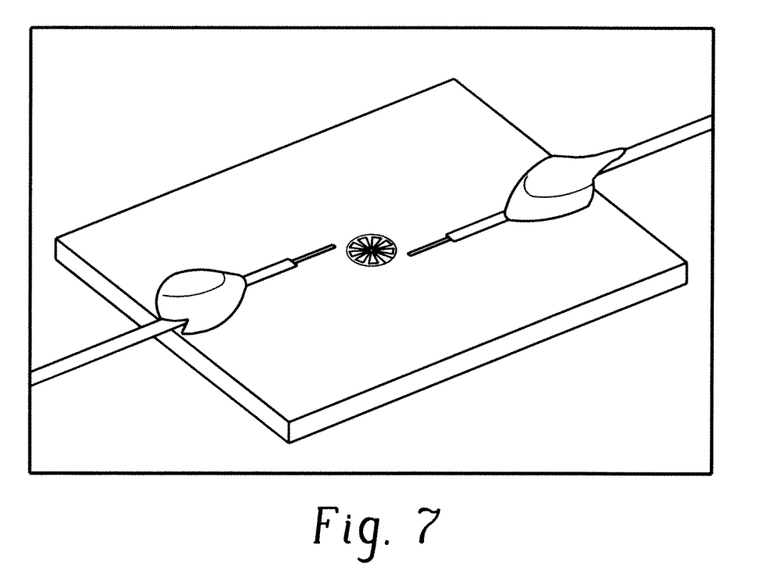
FIG. 7 shows a perspective view of yet another exemplary embodiment of a gripper subsystem.

The coplanar electrode design simplifies the microgripper device fabrication to a single mask fabrication process. The electrodes may be fabricated from a gold coated glass substrate, such as is available from Evaporated Metal Films, Inc. of Ithaca, N.Y. The patterns may be transferred onto the gold coated glass substrate using photolithography with a mask aligner, such as the OAI-200 Mask Aligner from OAI of San Jose, Calif. Wet etching may be followed to realize the electrode design as shown in FIG. 6. The etchant may be KI:I2 potassium iodine complex. BST thin films may be used for the dielectric layer. For example, BST thin films may be obtained by spin coating BST precursor solution onto the electrode at 2000 rpm for 60 seconds to obtain uniform thin films. A WS-400B-6NPP/LITE Spin Processor from Laurell Technologies Corporation of North Wales, Pa. The spin coated slides may be kept at ambient temperature for 10 minute to remove the volatile components of the solution. The amorphous film may then be annealed to a temperature of 400 degrees C. A single such film was approximately 50 nm. The thickness of the insulator (i.e., dielectric layer) may be verified, for example, using a Dektak 150 Surface Profiler by Veeco Instruments, Inc. of Plainview, N.Y. This process may be repeated to form a stack of BST films to achieve a desired thickness, such as 0.5 μm. A very thin layer of Teflon® AF may be spin coated onto the BST film at 5000 rpm for 60 seconds and cured at 250 degrees C. for 5 minutes on a hot plate to provide the hydrophobic surface. Clear transparent films of BST and Teflon® AF were obtained. FIG. 7 provides a photograph of an exemplary microgripper with the electrical connections to the electrodes.

Figure 8:
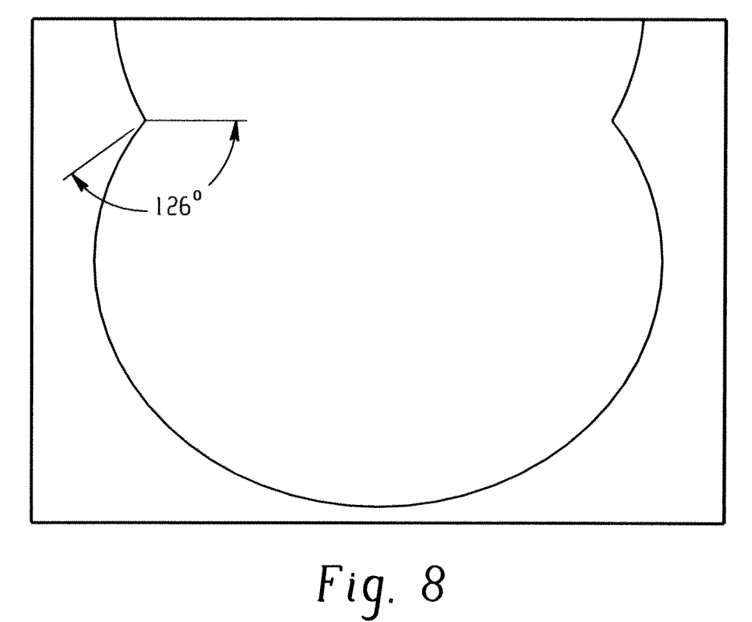
FIG. 8 is a perspective view of an exemplary liquid droplet in place on an exemplary embodiment of a gripper subsystem with no voltage applied.
Figure 9:
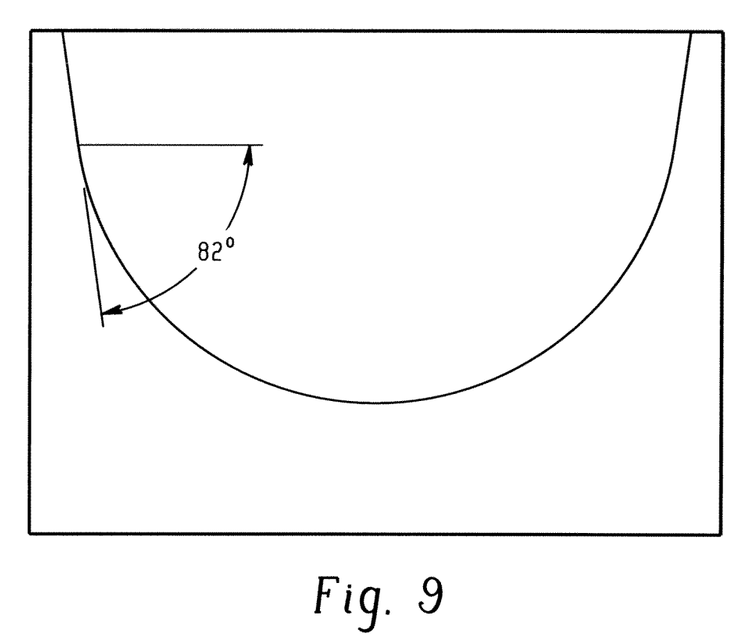
FIG. 9 is a block diagram of the liquid droplet of FIG. 8 with an exemplary lift voltage applied to positive and negative electrodes of the gripper subsystem.

Experiments were conducted to validate the contact angle change through electrowetting with the coplanar electrode. FIGS. 8 and 9 show a contact angle change of a 0.5 μL droplet of de-ionized water at zero volts and 28 volts, respectively. The droplet was placed at the center of the co-planar electrodes. Comparing FIGS. 8 and 9, the contact angle change can be observed at the different applied voltages.

Figure 10:
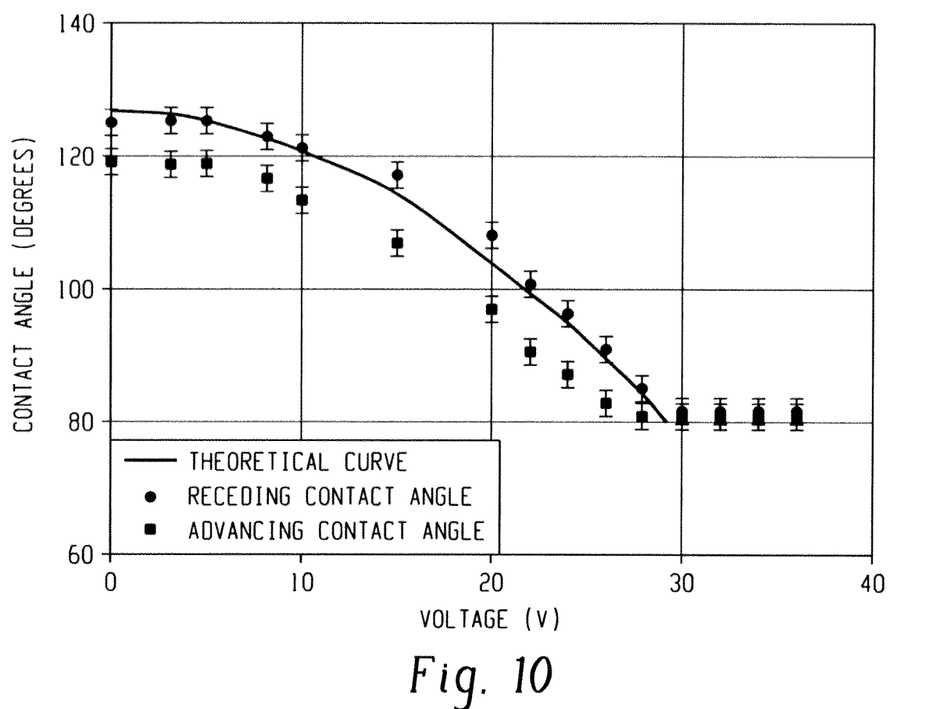
FIG. 10 is a graph showing a theoretical curve for contact angle measurements for a liquid bridge for an exemplary gripper subsystem at different voltage levels and measurement for receding and advancing contact.

Contact angles may be measured using a contact angle goniometer when the applied voltage was increased from zero volts to 30 volts (contact angle receding) and then decreased from 30 volts to zero volts (contact angle advancing). Suitable contact angle goniometers are available from rame-hart instrument co. of Netcong, N.J. FIG. 10 shows the experimental data from contact angle measurements and the theoretical prediction from the modified Young-Lippmann equation (Equation 2).

Two phenomena can be observed from the data of FIG. 10. First, the receding contact angle measurements are consistent with the theoretical prediction as the applied voltage is increased from 0 to 30 volts and the contact angle saturated at 82 degrees at approximately 28 volts. Second, a hysteresis exists between the advancing and receding contact angle. Various factors like the adsorption of the liquid molecules/ions to the insulator layer, surface roughness, charge trapping, and porosity of the insulator can account for the saturation and hysteresis phenomenon. For additional information on the saturation and hysteresis phenomenon, see Herberth, Fluid Manipulation by Means of Electrowetting-On-Dielectrics, PhD Thesis, University of Freiburg, May 2006, 184 pages, the contents of which are fully incorporated herein by reference.

Figure 11:
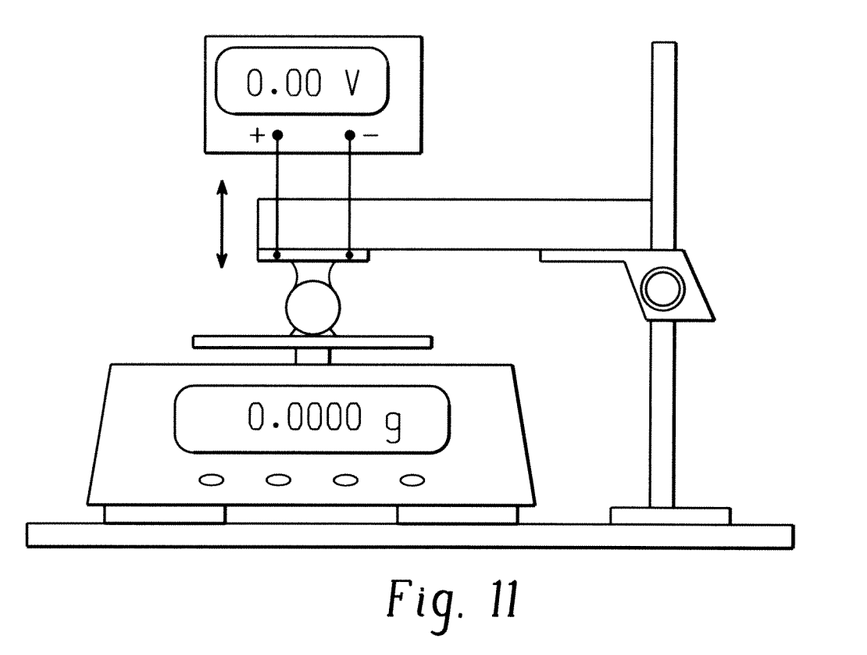
FIG. 11 is a block diagram of an exemplary setup for measuring lifting force in an exemplary embodiment of a gripper subsystem.

The lifting force of the microgripper was measured using an electronic balance from Sartorius AG of Goettingen, Germany having a resolution of 0.1 μN. The measurement setup with the electronic balance is shown in FIG. 11. A one millimeter diameter spherical glass bead was glued to the electronic balance. A precision Z-axis stage was used to lower the gripper to bring the droplet in contact with the glass bead to form the liquid bridge and to adjust the distance d between the droplet and the gripper surface (see FIG. 1). The generated lifting force was measured by the electronic balance. The entire set-up was placed in a shielded box to reduce or eliminate uncertainty due to airflow.

Figure 12:
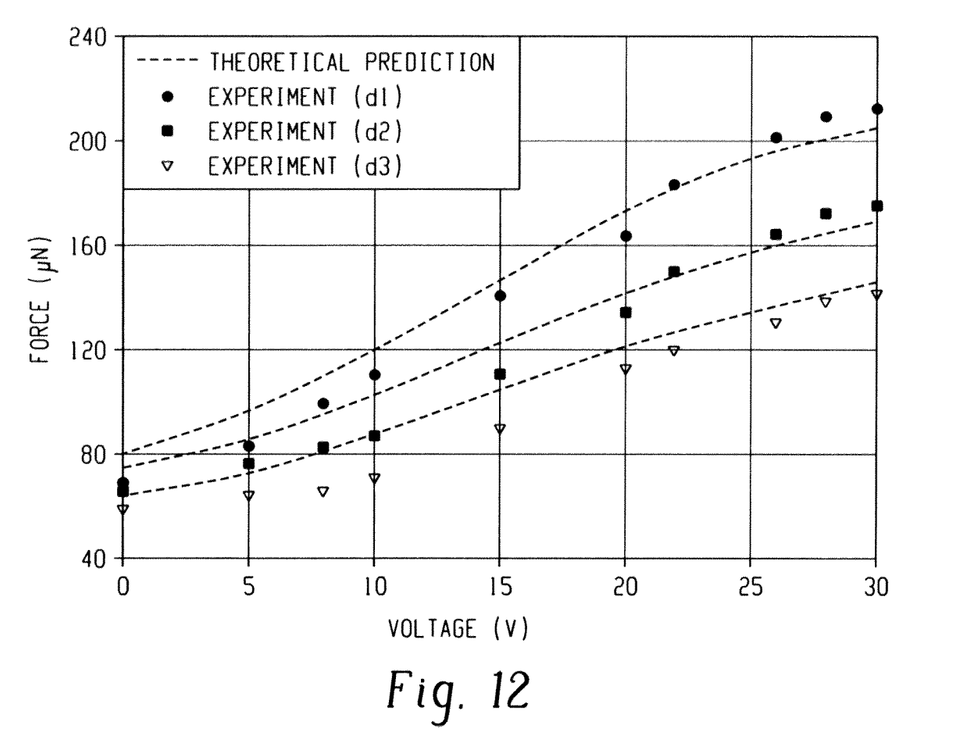
FIG. 12 is a graph showing a theoretical curve for lifting force measurements for an exemplary gripper subsystem at different voltage levels for several distances between the gripper subsystem and the micro component.

To study the effect of d on the lifting forces, measurements were taken at three different distances (d1=0.5 mm, d2=0.32 mm, d3=0.25 mm). For each fixed distance, lifting force measurements were made for different voltages. The results are presented in FIG. 12. The maximum lifting force was generated for the smallest distance (d3=0.25 mm). It can be seen that as the applied voltage is increased, the lifting forces of the microgripper increases. At V=28 volts, d=0.25 mm, the microgripper is capable of generating a lifting force of 213 μN. Lifting forces predicted by combining Equations (1) and (2) were also plotted in FIG. 12. Here the contact angle $\theta_2$ was measured to be 20 degrees and was constant during the tests. FIG. 12 shows that the experimental results are slightly higher than theoretical predictions. This may be because the modified Young-Lippmann equation (Equation 2) predicts the receding contact angle change and does not account for a hysteresis, such as the hysteresis shown in FIG. 10, between the advancing and receding contact angles.

FIG. 12 implies that objects having weight in the range of the lifting force can be picked up and released. The pick-up and release of micro objects using the microgripper was also demonstrated. The objects used in the demonstration were micro glass beads with mass ranges from 77 μN to 136 μN. To avoid dielectric breakdown the maximum applied voltage during the experiments was 120 volts. The droplet volume was 0.1 μL. In each demonstration, the glass bead was loosely placed on a stage. The microgripper was able to pick up and release each glass bead.

Figure 13:
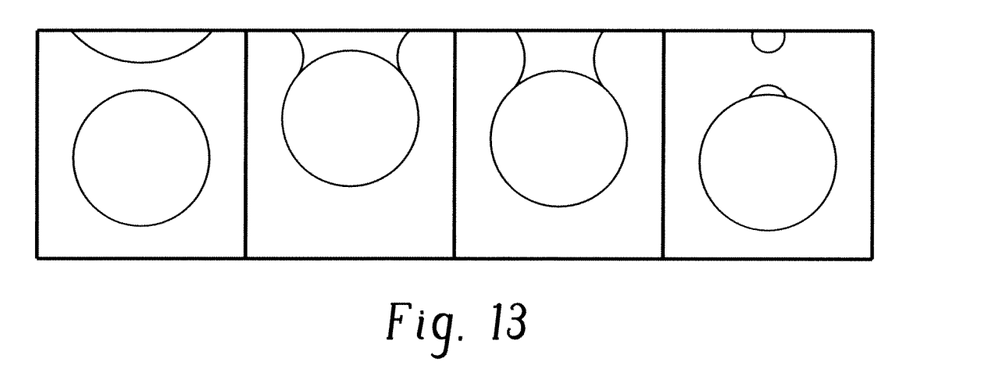
FIG. 13 shows a set of frames of another exemplary sequence in which an exemplary embodiment of a gripper subsystem approaches, lifts, holds, and releases a micro component.

Four microscopic photographs of a pick-up and release procedure are shown in FIG. 13 for a 13.9 milligram (136 μN) glass bead. In the first photograph, the gripper approaches the object (V=120 volts). The second photograph shows that the object is picked at a high voltage (V=120 volts). In the third photograph, the liquid bridge is elongated due to the reduction of applied voltage (V=80 volts). The fourth photograph shows the object is released at a low voltage (V=56 volts, release voltage).

In summary, various embodiments of a low-voltage capillary force microgripper for gripping micro objects are disclosed herein. Lifting forces for the capillary force microgripper do not have to be constant. Rather, the EWOD effect can be used to manipulate the lifting forces associated with the capillary force microgripper to facilitate object release. A coplanar gold electrode can be used to simplify micromachining of the gripper device. BST can be used as the dielectric insulation to facilitate actuation at lower applied voltages. Experiments have demonstrated that the lifting forces can be manipulated simply by varying the applied voltage on the electrodes. The pick-up and release of a variety of micro glass beads with different mass have been demonstrated.

Figure 14:
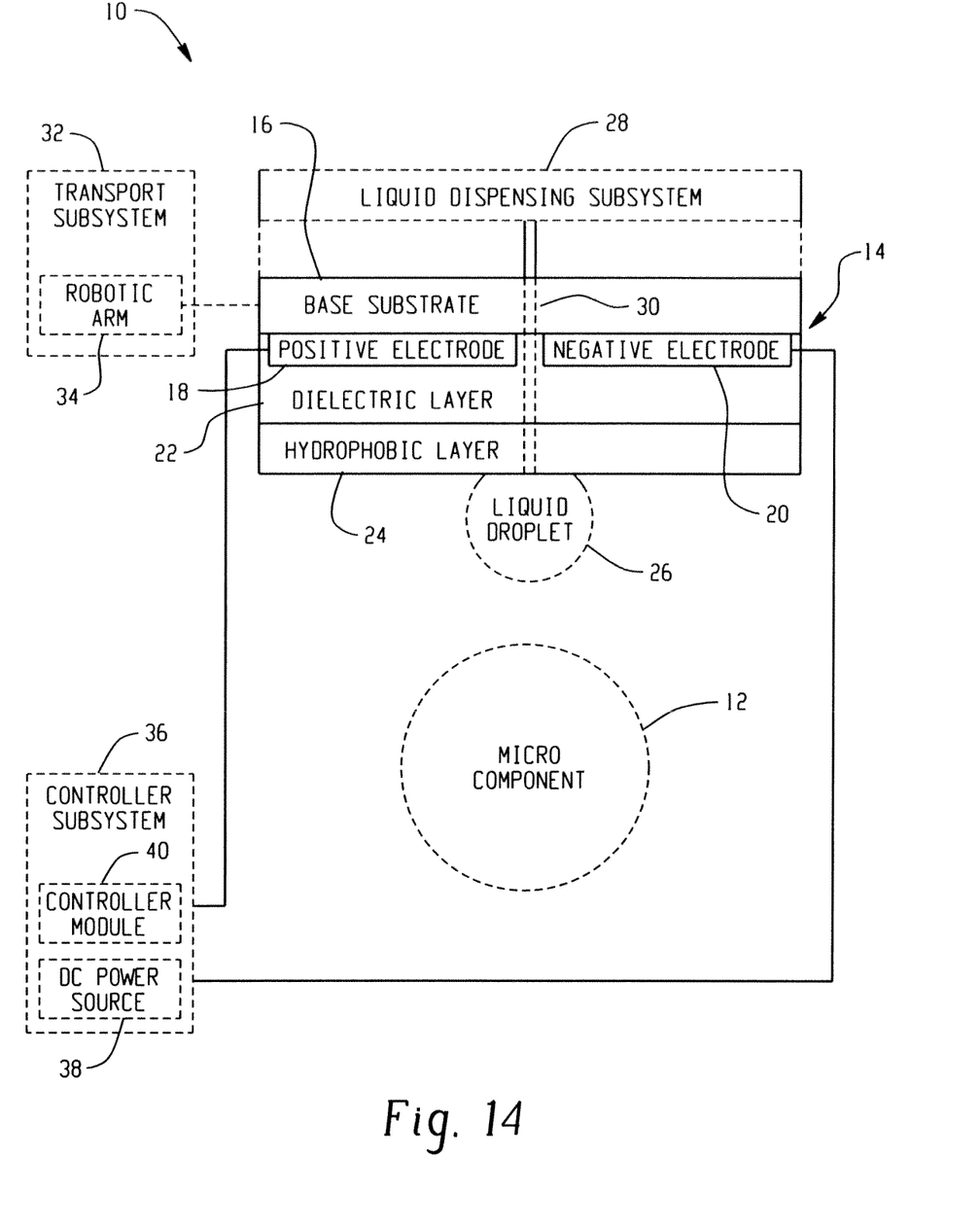
FIG. 14 is a block diagram of an exemplary embodiment of a system for manipulating a micro component.

With reference to FIG. 14, an exemplary embodiment of a system 10 for manipulation of a micro component 12 may including a gripper subsystem 14 for lifting, holding, and releasing the micro component. The gripper subsystem 14 may include a base substrate 16, a positive electrode 18, a negative electrode 20, a dielectric layer 22, and a hydrophobic layer 24. The base substrate 16 may have a work side and an opposing side. The positive electrode 18 may be secured to the work side of the base substrate 16. The negative electrode 20 may be suitably spaced from the positive electrode 18 and secured to the work side of the base substrate 16. The dielectric layer 22 may be formed over the work side of the base substrate 16 and the positive and negative electrodes 18, 20. The hydrophobic layer 24 may include a hydrophobic material with predictable electrowetting behavior formed over the dielectric layer 22 such that the dielectric layer 22 is between the work side of the base substrate 16 and the hydrophobic layer 24.

The base substrate 16, positive and negative electrodes 18, 20, dielectric layer 22, and hydrophobic layer 24 may be constructed and arranged such that a DC voltage applied to the positive and negative electrodes 18, 20 can be adjustably controlled in conjunction with providing a liquid droplet 26 to the hydrophobic layer 24 so as to change a capillary force between the liquid droplet 26 and the micro component 12 in order to i) lift the micro component 12 at a lift voltage after moving the gripper subsystem 14 to an initial position of the micro component 12, ii) hold the micro component 12 at a voltage level within a hold voltage range while the gripper subsystem 14 is moved from the initial position to a delivery position, and iii) release the micro component 12 at a release voltage while at the delivery position. The release voltage may be less than the lift voltage and the hold voltage range may be between the lift voltage and the release voltage.

In another embodiment, the system 10 also may include a liquid dispensing subsystem 28 in operative communication with the gripper subsystem 14 for providing the liquid droplet 26 to the hydrophobic layer 24. In the embodiment being described, the liquid dispensing subsystem 28 may provide the liquid droplet 26 through an aperture 30 passing through the base substrate 16, dielectric layer 22, and hydrophobic layer 24. In a further embodiment, the liquid dispensing subsystem may include an actuator to control dispensing of the liquid droplet through the aperture in a manner that compensates for evaporation of the liquid droplet. In another further embodiment, the actuator may include a piezoelectric transducer (PZT). The PZT actuator provides on-chip droplet generation and volume regulation.

In yet another embodiment, the system 10 also may include a transport subsystem 32 to which the gripper subsystem 14 is mechanically linked for translational movement of the gripper subsystem 14 within a three dimensional area. The transport subsystem 32 may provide for movement of the gripper subsystem 14 to the initial position of the micro component 12 and movement of the gripper subsystem 14 from the initial position to the delivery position. In the embodiment being described, the transport subsystem 32 may include a robotic arm 34 to which the gripper subsystem is mechanically linked for translational movement.

In still another embodiment, the system 10 also may include a controller subsystem 36 in operative communication with the gripper subsystem 14 and including a DC power source 38 and a controller module 40. The DC power source 38 may supply the DC voltage applied to the positive and negative electrodes 18, 20. The controller module 40 being in operative communication with the DC power source 38 may adjustably control the DC voltage applied to the positive and negative electrodes 18, 20 in conjunction with i) controlling a transport subsystem 32 to which the gripper subsystem 14 is mechanically linked for translational movement of the gripper subsystem 14 to the initial position of the micro component 12, ii) controlling a liquid dispensing subsystem 28 to provide the liquid droplet 26 to the hydrophobic layer 24, and iii) controlling the transport subsystem 32 for translational movement of the gripper subsystem 14 from the initial position to the delivery position.

In still yet another embodiment, the positive and negative electrodes 18, may be coplanar. In another embodiment, the positive and negative electrodes 18, may be arranged in an interdigitated radial pattern (e.g., see FIG. 4) in a manner that facilitates coverage of generally equal portions of the positive and negative electrodes 18, 20 by the liquid droplet 26. In yet another embodiment, the positive and negative electrodes 18, 20 may be spaced apart by about 20 μm (e.g., see FIG. 4, Gap (t)).

In another embodiment, the dielectric layer 22 may include a dielectric material with a dielectric constant of about 50 at a thickness of about 0.5 μm. In the embodiment being described, the dielectric material may include barium strontium titanate (BST). Other suitable materials are also envisioned for the dielectric layer 22. For example, cytop, parylene, silicon dioxide, silicon nitride, Polydimethylsiloxane (PDMS), or other suitable materials may be used in the dielectric layer.

In yet another embodiment, the hydrophobic layer 24 may include a fluoropolymer material with a low dielectric constant at a thickness of about 100 nm. In the embodiment being described, the fluoropolymer material may include Teflon® amorphous fluoropolymer (AP). Other suitable materials are also envisioned for the hydrophobic layer 24. For example, poly(tetrafluoroethylene) (PTFE), SU-8 photoresist, Polydimethylsiloxane (PDMS), zinc oxide, titanium oxide, carbon nanotubes, Duralon, or other suitable materials may be used in the hydrophobic layer. In still yet another embodiment, the hydrophobic layer may include a superhydrophobic material with a low dielectric constant. In this embodiment, the superhydrophobic material may include self assembled monolayers (SAMs) of methyltricholorosilane (MTS). Use of a superhydrophobic material may provide higher initial contact angles (i.e., at V=0). For example, initial contact angles of 150 to 160 degrees and greater have been measured with a hydrophobic layer formed by SAMs of MTS.

In still another embodiment, the liquid droplet 26 may be formed by an ionic liquid with suitably slow evaporation characteristics. In the embodiment being described, the ionic liquid forming the liquid droplet may include de-ionized water in an amount of about 0.5 μL. In another embodiment, an RTIL, such as 1-butyl-3-methylimidazolium hexafluorophosphate ($BmimPF_6$) may be used in conjunction with electrowetting on co-planar electrodes to dynamically change the contact angle of a liquid bridge to control the capillary lifting forces. In an exemplary embodiment using $BmimPF_6$, the maximum capillary force was 146 μN. Other suitable ionic liquids are also envisioned for the liquid droplet 26. For example, triethanol/methylammonium methane sulphonate, diethanol ethylmethoxy methylammonium methane sulphonate, or other suitable ionic liquids may be used in the liquid droplet. Similarly, other suitable amounts are envisioned for the liquid droplet. For example, the size of the liquid droplet may range from about 0.1 μL to about 0.5 μL.

In still yet another embodiment, the liquid droplet 26 may form a liquid bridge between the hydrophobic layer 24 and the micro component 12 when the gripper subsystem 14 is moved to within a suitable distance of the micro component 12. The liquid bridge defining the capillary force. In the embodiment being described, adjustment of the DC voltage applied to the positive and negative electrodes 18, 20 may change the capillary force by adjusting a first contact angle between the liquid bridge and the hydrophobic layer 24 and a second contact angle between the liquid bridge and the micro component 12.

In one embodiment, the lift voltage may not exceed 28 volts DC. In other embodiments, the lift voltage may be up to 120 volts DC or higher depending on the combinations of materials used for the liquid droplet, dielectric layer, and hydrophobic layer. In another embodiment, the micro component 12 includes a hydrophilic material. In the embodiment being described, the hydrophilic material may include silicon. Other suitable materials are also envisioned for the micro component 12. For example, silicon dioxide, silicon nitride, silver, gold, copper, Poly(methyl methacrylate) (PMMA), gallium-arsenide (GaAs), or other suitable materials may be used in the micro component.

In another embodiment, the dielectric and hydrophobic layers may be formed by a thin insulator layer that exhibits suitable dielectric and hydrophobic characteristics. The insulator layer may be formed using hydrophobic amorphous Teflon® AF. In this embodiment, the insulator layer may be a thickness of about 0.45 μm. This embodiment utilizes Teflon° AF as both the dielectric and hydrophobic layers. With both layers comprising the same material, this arrangement may be easier to fabricate, but may require higher voltage to be applied to the microgripper than embodiments using a different dielectric material, such as BST. Conversely, embodiments using BST for the dielectric layer and Teflon® AF for the hydrophobic layer may permit the microgripper to operate at lower voltages.

Figure 15:
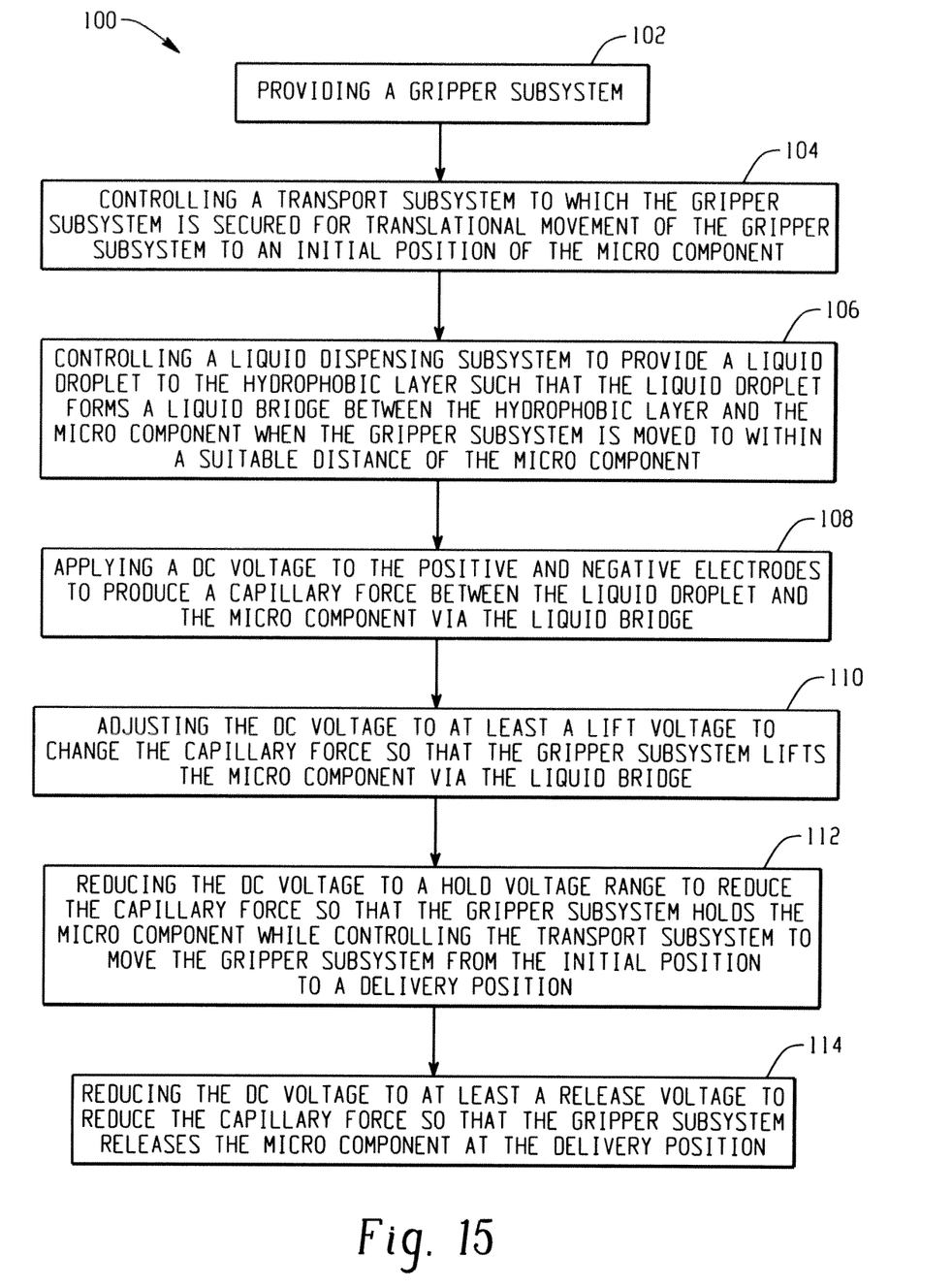
FIG. 15 is a flowchart of an exemplary embodiment of a process for manipulating a micro component.

With reference to FIG. 15, an exemplary embodiment of a process 100 for manipulating a micro component begins at 102 where a gripper subsystem is provided. The gripper subsystem may include a base substrate, a positive electrode, a negative electrode, a dielectric layer, and a hydrophobic layer. The base substrate may have a work side and an opposing side. The positive electrode may be secured to the work side of the base substrate. The negative electrode may be suitably spaced from the positive electrode and secured to the work side of the base substrate. The dielectric layer may be formed over the work side of the base substrate and the positive and negative electrodes. The hydrophobic layer may include a hydrophobic material with predictable electrowetting behavior and may be formed over the dielectric layer such that the dielectric layer is between the work side of the base substrate and the hydrophobic layer.

At 104, a transport subsystem to which the gripper subsystem is mechanically linked may be controlled for translational movement of the gripper subsystem to an initial position of the micro component. Next, a liquid dispensing subsystem may be controlled to provide a liquid droplet to the hydrophobic layer such that the liquid droplet forms a liquid bridge between the hydrophobic layer and the micro component when the gripper subsystem is moved to within a suitable distance of the micro component (106). At 108, a DC voltage may be applied to the positive and negative electrodes to produce a capillary force between the liquid droplet and the micro component via the liquid bridge. Next, the DC voltage may be adjusted to at least a lift voltage to change the capillary force so that the gripper subsystem lifts the micro component via the liquid bridge (110). At 112, the DC voltage may be reduced to a hold voltage range to reduce the capillary force so that the gripper subsystem holds the micro component while controlling the transport subsystem to move the gripper subsystem from the initial position to a delivery position. Next, the DC voltage may be reduced to at least a release voltage to reduce the capillary force so that the gripper subsystem releases the micro component at the delivery position (114).

In another embodiment, the process 100 may also include providing the liquid droplet through an aperture passing through the base substrate, dielectric layer, and hydrophobic layer. In yet another embodiment, adjustment of the DC voltage applied to the positive and negative electrodes may change the capillary force by adjusting a first contact angle between the liquid bridge and the hydrophobic layer and a second contact angle between the liquid bridge and the micro component. In still another embodiment, the lift voltage does not exceed 28 volts DC.

With reference to FIGS. 14 and 16, an exemplary embodiment of a process 200 for manufacturing an exemplary embodiment of a gripper subsystem 14 begins at 202 where patterns for the positive and negative electrodes 18, 20 may be transferred to a conductive coating on the work side of the base substrate 16 using photolithography. At 204, the conductive coating may be wet etched to form the positive and negative electrodes 18, 20 on the work side of the base substrate 16. At 206, a thin layer of dielectric material may be spin coated over the work side of the base substrate 16 and the positive and negative electrodes 18, 20. At 208, the thin layer of dielectric material may be left at ambient temperature for a predetermined time to remove volatile components of the dielectric material. At 210, the thin layer of dielectric material may be annealed to a predetermined temperature. Items 206 through 210 may be repeated until a thin film stack of dielectric material reaches a desired thickness to form the dielectric layer 18. At 214, a thin layer of hydrophobic material may be spin coated over the dielectric layer 18. At 216, the thin layer of hydrophobic material may be cured at a predetermined temperature for a predetermined time to form the hydrophobic layer 24.

In one embodiment, the conductive coating on the work side of the base substrate 16 may include gold. In another embodiment, the wet etching may be accomplished using a KI:I2 potassium iodine complex etchant. In yet another embodiment, the positive and negative electrodes 18, 20 may be coplanar. In still another embodiment, the positive and negative electrodes 18, 20 may be arranged in an interdigitated radial pattern (e.g., see FIG. 4) in a manner that facilitates coverage of generally equal portions of the positive and negative electrodes 18, 20 by the liquid droplet 26. In still yet another embodiment, the positive and negative electrodes 18, 20 may be spaced apart by about 20 µm (see FIG. 4).

In one embodiment, the dielectric material may include barium strontium titanate (BST). In another embodiment, each thin layer of dielectric material may be spin coated at about 2000 rpm for about 60 seconds. In yet another embodiment, each thin layer of dielectric material may be left at ambient temperature for about ten (10) minutes. In still another embodiment, each thin layer of dielectric material is annealed to about 400 degrees C. In still yet another embodiment, a desired thickness for each thin layer of dielectric material may be about 50 nm. In another embodiment, the desired thickness of the thin film stack may be about 0.5 µm. In yet another embodiment, a desired dielectric constant for the thin film stack may be about 50.

In one embodiment, the thin layer of hydrophobic material may be spin coated at about 5000 rpm for about 60 seconds. In another embodiment, the thin layer of hydrophobic material may be cured at about 250 degrees C. for about five (5) minutes. In yet another embodiment, a desired thickness for the thin layer of hydrophobic material may be about 100 nm. In still another embodiment, the hydrophobic material may include a fluoropolymer material with a low dielectric constant. In the embodiment being described, the fluoropolymer material may include Teflon® amorphous fluoropolymer (AP).

It will be appreciated that various above-disclosed and other features and functions, or alternatives thereof, may be desirably combined into many other different systems or applications. It will also be appreciated that various presently unforeseen or unanticipated alternatives, modifications, variations or improvements therein may be subsequently made by those skilled in the art which are also intended to be encompassed by the following claims.

The invention claimed is:

1. An apparatus for manipulation of a micro component, comprising:
   a gripper subsystem for lifting, holding, and releasing a micro component, comprising:
      a base substrate having a work side and an opposing side;
      a positive electrode secured to the work side of the base substrate;
      a negative electrode suitably spaced from the positive electrode and secured to the work side of the base substrate, such that the positive and negative electrodes are coplanar with each other;
      a dielectric layer formed over the work side of the base substrate and the positive and negative electrodes; and
      a hydrophobic layer comprising a hydrophobic material with predictable electrowetting behavior formed over the dielectric layer such that the dielectric layer is between the work side of the base substrate and the hydrophobic layer, wherein the base substrate, positive and negative electrodes, dielectric layer, and hydrophobic layer are constructed and arranged such that a DC voltage applied to the positive and negative electrodes can be adjustably controlled in conjunction with providing a liquid droplet to the hydrophobic layer, such that the liquid droplet extends over the positive electrode and the negative electrode, so as to change a capillary force between the liquid droplet and the micro component in order to i) lift the micro component at a lift voltage after moving the gripper subsystem to an initial position of the micro component, ii) hold the micro component at a voltage level within a hold voltage range while the gripper subsystem is moved from the initial position to a delivery position, and iii) release the micro component at a release voltage while at the delivery position, the release voltage being less than the lift voltage and the hold voltage range being between the lift voltage and the release voltage.

2. The apparatus of claim 1, the liquid dispensing subsystem comprising an actuator to control dispensing of the liquid droplet through the aperture in a manner that compensates for evaporation of the liquid droplet.

3. The apparatus of claim 2, the actuator comprising a piezoelectric transducer.

4. The apparatus of claim 1, further comprising:
   a transport subsystem to which the gripper subsystem is mechanically linked for translational movement of the gripper subsystem within a three dimensional area, the transport subsystem providing for movement of the gripper subsystem to the initial position of the micro component and movement of the gripper subsystem from the initial position to the delivery position.

5. The apparatus of claim 4, the transport subsystem comprising:
   a robotic arm to which the gripper subsystem is mechanically linked for translational movement.

6. The apparatus of claim 1, further comprising:
   a controller subsystem in operative communication with the gripper subsystem comprising:
      a DC power source for supplying the DC voltage applied to the positive and negative electrodes; and
      a controller module in operative communication with the DC power source for adjustably controlling the DC voltage applied to the positive and negative electrodes in conjunction with i) controlling a transport subsystem to which the gripper subsystem is mechanically linked for translational movement of the gripper subsystem to the initial position of the micro component, ii) controlling a liquid dispensing subsystem to provide the liquid droplet to the hydrophobic layer, and iii) controlling the transport subsystem for translational movement of the gripper subsystem from the initial position to the delivery position.

7. The apparatus of claim 1 wherein the positive and negative electrodes are arranged in an interdigitated radial pattern in a manner that facilitates coverage of generally equal portions of the positive and negative electrodes by the liquid droplet.

8. The apparatus of claim 1, the dielectric layer comprising a dielectric material with a high dielectric constant.

9. The apparatus of claim 8, the dielectric material comprising barium strontium titanate (BST).

10. The apparatus of claim 1, the hydrophobic layer comprising a fluoropolymer material with a low dielectric constant.

11. The apparatus of claim 10, the fluoropolymer material comprising Teflon® amorphous fluoropolymer (AP).

12. The apparatus of claim 1, the hydrophobic layer comprising a superhydrophobic material with a low dielectric constant.

13. The apparatus of claim 12, the superhydrophobic material comprising self assembled monolayers of methyltricholorosilane (MTS).

14. The apparatus of claim 1 wherein the liquid droplet forms a liquid bridge between the hydrophobic layer and the micro component when the gripper subsystem is moved to within a suitable distance of the micro component, the liquid bridge defining the capillary force.

15. The apparatus of claim 14 wherein adjustment of the DC voltage applied to the positive and negative electrodes changes the capillary force by adjusting a first contact angle between the liquid bridge and the hydrophobic layer and a second contact angle between the liquid bridge and the micro component.

16. The apparatus of claim 1 wherein the lift voltage does not exceed 28 volts DC.

17. The apparatus of claim 1, further comprising:
a liquid dispensing subsystem in operative communication with the gripper subsystem for providing the liquid droplet to the hydrophobic layer.

18. The apparatus of claim 17, wherein the liquid dispensing subsystem provides the liquid droplet through an aperture passing through the base substrate, dielectric layer, and hydrophobic layer.

19. The apparatus of claim 1, wherein the positive and negative electrodes are interdigitated and positioned in a radial configuration.

20. A method for manipulation of a micro component, comprising:
a) providing a gripper subsystem with a base substrate having a work side and an opposing side, a positive electrode secured to the work side of the base substrate, a negative electrode suitably spaced from the positive electrode and secured to the work side of the base substrate, a dielectric layer formed over the work side of the base substrate and the positive and negative electrodes, and a hydrophobic layer comprising a hydrophobic material with predictable electrowetting behavior formed over the dielectric layer such that the dielectric layer is between the work side of the base substrate and the hydrophobic layer;
b) controlling a transport subsystem to which the gripper subsystem is mechanically linked for translational movement of the gripper subsystem to an initial position of the micro component;
c) controlling a liquid dispensing subsystem to provide a liquid droplet to the hydrophobic layer such that the liquid droplet forms a liquid bridge between the hydrophobic layer and the micro component when the gripper subsystem is moved to within a suitable distance of the micro component;
d) applying a DC voltage to the positive and negative electrodes to produce a capillary force between the liquid droplet and the micro component via the liquid bridge;
e) adjusting the DC voltage to at least a lift voltage to change the capillary force so that the gripper subsystem lifts the micro component via the liquid bridge;
f) reducing the DC voltage to a hold voltage range to reduce the capillary force so that the gripper subsystem holds the micro component while controlling the transport subsystem to move the gripper subsystem from the initial position to a delivery position; and
g) reducing the DC voltage to at least a release voltage to reduce the capillary force so that the gripper subsystem releases the micro component at the delivery position.

21. The method of claim 20 wherein adjustment of the DC voltage applied to the positive and negative electrodes changes the capillary force by adjusting a first contact angle between the liquid bridge and the hydrophobic layer and a second contact angle between the liquid bridge and the micro component.

22. The method of claim 20, further comprising:
h) providing the liquid droplet through an aperture passing through the base substrate, dielectric layer, and hydrophobic layer.

23. The method of claim 20, wherein the positive and negative electrodes are interdigitated and positioned in a radial configuration.

* * * * *